(12) United States Patent
Chen et al.

(10) Patent No.: US 7,192,850 B2
(45) Date of Patent: Mar. 20, 2007

(54) METHOD FOR DOPING QUANTUM DOTS

(75) Inventors: Hsueh-Shih Chen, Hsinchu (TW);
Dai-Luon Lo, DahuTownship, Miaoli County (TW); Chien-Ming Chen, Yangmei Township, Taoyuan County (TW); Gwo-Yang Chang, Jiali Township, Tainan County (TW)

(73) Assignee: Industrial Technology Research Institute, Hsinchu (TW)

( * ) Notice: Subject to any disclaimer, the term of this patent is extended or adjusted under 35 U.S.C. 154(b) by 316 days.

(21) Appl. No.: 11/024,801

(22) Filed: Dec. 30, 2004

(65) Prior Publication Data

US 2005/0287691 A1    Dec. 29, 2005

(30) Foreign Application Priority Data

Jun. 24, 2004    (TW) ................. 93118299 A

(51) Int. Cl.
*H01L 21/00*    (2006.01)
(52) U.S. Cl. .................. 438/479; 438/483; 438/93; 257/E21.001; 117/11; 977/774
(58) Field of Classification Search ............... 438/479, 438/483, 46, 77, 84–86, 63; 117/11, 68; 977/734; 257/E21.001, E31.001
See application file for complete search history.

(56) References Cited

U.S. PATENT DOCUMENTS

| | | | |
|---|---|---|---|
| 6,444,143 B2 * | 9/2002 | Bawendi et al. ...... 252/301.6 S |
| 6,737,293 B2 * | 5/2004 | Andriessen ................... 438/99 |
| 6,780,242 B2 * | 8/2004 | Norris ......................... 117/104 |
| 6,881,481 B2 * | 4/2005 | Hasegawa .................... 428/402 |
| 7,022,628 B2 * | 4/2006 | Kim et al. ..................... 257/14 |
| 7,094,361 B2 * | 8/2006 | Riman et al. .......... 252/301.36 |
| 7,105,051 B2 * | 9/2006 | Peng et al. ................... 117/68 |
| 2001/0002275 A1 * | 5/2001 | Oldenburg et al. ......... 427/214 |
| 2002/0103517 A1 * | 8/2002 | West et al. ................... 607/88 |
| 2003/0106488 A1 * | 6/2003 | Huang et al. ................. 117/68 |
| 2003/0116080 A1 * | 6/2003 | Huang ........................... 117/3 |
| 2003/0234978 A1 * | 12/2003 | Garito et al. ............. 359/341.5 |
| 2004/0247861 A1 * | 12/2004 | Naasani ...................... 428/336 |
| 2005/0001539 A1 * | 1/2005 | Andriessen ................. 313/503 |
| 2006/0148105 A1 * | 7/2006 | Sharma et al. ................. 438/3 |
| 2006/0170331 A1 * | 8/2006 | Betram et al. .............. 313/498 |

* cited by examiner

*Primary Examiner*—Savitri Mulpuri
(74) *Attorney, Agent, or Firm*—Bacon & Thomas, PLLC

(57) ABSTRACT

A doping method for forming quantum dots is disclosed, which includes following steps: providing a first precursor solution for a group II element and a second precursor solution for a group VI element; heating and mixing the first precursor solution and the second precursor solution for forming a plurality of II–VI compound cores of the quantum dots dispersing in a melting mixed solution; and injecting a third precursor solution for a group VI element and a forth precursor solution with at least one dopant to the mixed solution in turn at a fixed time interval in order to form quantum dots with multi-shell dopant; wherein the dopant described here is selected from a group consisting of transitional metal and halogen elements. This method of the invention can dope the dopants in the inner quantum dot and enhance the emission intensity efficiently.

18 Claims, 5 Drawing Sheets

METHOD FOR DOPING QUANTUM DOTS

TECHNICAL FIELD

The present invention relates to a method for doping quantum dots and, more particularly, to a method for doping semiconductor quantum dots to manufacture powder products of doped quantum dots.

BACKGROUND OF THE INVENTION

Generally, quantum dots can be prepared by many conventional methods. For example, the chemical colloidal method, which is simple, can be applied for mass production. Another method frequently applied can be self-assembly method. The self-assembly method makes the quantum dots growing self-aggregately on the surface of a specific substrate based on the lattice mismatch principle by using the molecular-beam epitaxy process or the chemical vapor deposition process. The self-assembly method can produce quantum dots in order and, therefore, is mostly applied to form a thin film on the substrate. In addition, lithography and etching is also suggested to write the desired pattern of quantum dots directly on a substrate through a light beam or an electron beam. However, it is time-consuming and cannot be carried out on large scale. The fourth possible method is split-gate approach, which forms a two-dimensional confinement on the plane of a two-dimensional quantum well by introducing an applied voltage on a substrate. It can modify the shape and size of the quantum dots by controlling the gate and, therefore, is suitable for academic research, but cannot be applied to mass production.

It is known that quantum dots can be applied to a variety of purposes, such as the application of blue light lasers, optical sensors, single electron transistors (SET), storage medium, catalysts, and quantum computing. Even in the medical field, quantum dots that emit lights with different wavelength can be used to produce fluorescent labels, which act as "nano-bar codes" for bio-detection. Hence, quantum dots become a focus in the field of either theoretical research or experimental application.

The wavelengths of absorption by the quantum dots or those of emission of radiation from quantum dots are affected and varied by several property factors, such as components, peripherally attached or doped materials, and the particle size of the quantum dots. Thus, the adjustment of the wavelengths of absorption and emission lights of quantum dots can be achieved by selecting adequate element components, particle size, peripherally attached materials, or dopants. Generally, the componential elements and the peripherally adsorbed or attached materials will determine the required reaction condition in precedence. Therefore, for a specific reaction condition, the properties of the absorption and emission lights can only be further adjusted by controlling the particle size and the type of dopants. Currently, there are many research groups proceeding researches of doping technique for quantum dots. However, most of the results reveal that reaction in low temperature can improve only the uniformity of dopants in quantum dots effectively. However, the resulted distribution of the particle size and the crystal phase of quantum dots are poor. On the other hand, research reports reveals that high temperature reaction process for manufacturing quantum dots can obtain good crystal phase and nearly the same particle size. However, the dopants will be easily separated out of the quantum dots under such a high temperature. As a result, the probability for successfully doping quantum dots is decreased.

It is known that doping is a mature technique in conventional semiconductor process. Generally, the dopants can be dispersed uniformly by implantation or diffusion. The implantation is achieved by projecting the ions with high energy into the crystals and is mainly applied to semiconductor thin films. On the other hand, diffusion is mainly achieved through a high temperature sintering, which drives the dopants into crystals at high temperature and is frequently used for lump materials or powders having big particle size. As for doping of micro-particles or super-micro-particles, mixing doping achieved by adding dopants during the synthesis of micro-particle is mostly used. However, owing to the precipitation trend of dopants at high temperature, there is no common technique for putting dopants into the interior of the quantum dots effectively and keeping quantum dots with high quality of properties at the same time. In other word, the dopants can only adhere to the surface of the quantum dots during the growth of the crystal at a high temperature. Therefore, the wavelength of the emission light cannot be adjusted easily through the high temperature process.

Currently, recent researchers for mixing doping focus on selection of adequate type of doping precursor. For example, elemental form of dopants or solutions of inorganic salts are used as precursors in several researches. In a report for preparing ZnSe quantum dots doped with copper, J. F. Suyver dispersed copper acetate (Cu(CH3COO)2) in tri-n-octylphosphine (TOP) to form a Cu-TOP solution first. The Cu-TOP solution is then mixed with a Se-TOP solution formed by the same manner for the Cu-TOP solution to obtain a fully dispersed Se—Cu-TOP mixture. Thereafter, diethylzinc ($Et_2Zn$) is added into the Se—Cu-TOP mixture and mixed. The resulted mixture is poured into the hexadecylamine (HDA) which is melted at a high temperature. After adequate reaction is performed, ZnSe quantum dots doped with copper are obtained. Similarly, the iodine ($I_2$) or manganese chloride ($MnCl_2$) can be dispersed in TOP by the same manner. However, the possibility of success for doping depends on the various chemical properties of the precursor.

Furthermore, adequate precursor for preparing quantum dots can be prepared through other options. For example, the precursor can also be prepared by using organic metal, wherein the dopant is added into the reaction system in the form of organic metal precursor. Through proper selection of adequate organic metals, the mutual reaction between the organic metal precursor and the organic solvent, as well as the decomposition rate of the organic metal precursor at high temperature can be adjusted. Generally speaking, a better level of doping could be obtained through the delicate selection of the combinations. Moreover, it is commonly agreed that the organic metal precursor is better precursor than the elemental form of dopants or solutions of inorganic salts are. The bonding formed between the surface and the solvent of the organic metal dopant (HAD or TOP) during the formation of quantum dots has better affinity and, therefore, can adsorb more dopants on the surface. In addition, the molecules of the solvent will remain at the surface and be further encapsulated inside the crystal as the crystal grows subsequently. Nevertheless, the surface precipitation of dopants in high temperature reaction still restrains the dopants from involving in the interior shell of the crystal. Moreover, even addition of dopants by turns during the formation of quantum dots still cannot prevent the dopants from precipitating effectively.

The present invention aims at the aforementioned problems and develops an effective doping technique for quantum dots. The present invention overcomes the precipitation of dopants at the surface and forms dopants with multilayer structure through the reaction mechanism of repeated and alternate injection. Therefore, the dopants are fixed effectively in the interior of the quantum dots, and the light-emitting properties of the quantum dots can be improved successfully.

SUMMARY OF THE INVENTION

The object of the present invention is to provide a method for doping quantum dots so that the dopants can be implanted into the crystals of quantum dots effectively. Consequently, the wavelengths of the absorption and emission lights of the semiconductor quantum dots are adjusted and the radiation efficiency thereof is improved.

To achieve the above object, the method for doping quantum dots of the present invention includes the following steps. First, a first precursor solution containing a group II element and a second precursor solution containing a group VI element are provided. Afterwards, the first precursor solution and the second precursor solution are heated and mixed for forming a melted and mixed solution having a plurality of cores of quantum dots dispersing therein. Finally, a third precursor solution containing a group VI element and a forth precursor solution having at least one dopant are added into the mixed solution by turns at a fixed time interval for forming quantum dots wrapped with multilayer dopants. Furthermore, the dopant is selected from a group consisting of transitional metals and halogen elements.

The group II element in the first precursor solution is not limited, and is preferred to be zinc (Zn), cadmium (Cd), or mercury (Hg). The group VI element in the second precursor solution is not limited, and is preferred to be oxygen (O), sulfur (S), selenium (Se), or tellurium (Te). Therefore, the core of the quantum dot thus formed are preferred to be ZnSe, CdSe, CdS, HgS, ZnO, ZnS, SnS, ZnTe, or CdTe. The solvent of the second and the third precursor solutions are not limited, and preferred to be to tri-n-octylphosphine (TOP). The selection of solvent can stand on no decomposition at high temperature and being melted during the crystallization of quantum dots. The first precursor solution is not limited, and is preferred to be hexadecylamine (HDA) The first precursor solution may optionally further contain a surface-active agent, such as the lauric acid or the stearic acid to bond with the group II element. Moreover, the supersonic vibration can be selectively utilized to assist the dispersion when the above solutions are prepared.

The dopant can be a transitional metal. Preferably, the dopant is Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, or Au, or a halogen element, such as chlorine (Cl) or iodine (I). The fourth precursor solution can be composed of a solvent mixed with an organic metal, a metal salt, a metal element, a metal compound, a halogen element, or a halogen compound. Preferably, the solvent is tri-n-octylphosphine (TOP). Also supersonic vibration can be used to achieve the mixing for uniform dispersion.

In the method for doping quantum dots of the present invention, when the first precursor solution is mixed with the second precursor solution, the heating temperature preferably ranges from 200 to 400° C. When the third precursor solution containing group VI element and the fourth precursor solution containing a dopant are added into the mixed solution, the number of times that the third and fourth precursor solutions are added into the mixed solution are preferably controlled in a range from 2 to 8 to prevent generation of too many crystal defects. The time interval between the addition of the third and fourth precursor solutions can be adjusted according to the requirement of the particle size. Preferably, the time interval ranges from 30 seconds to 3 minutes. Similarly, the temperature for the growth of crystals should be decided according to the composition of solutions and the particle size. After the cores of quantum dots are encapsulated with dopants, preferably a ZnS precursor solution is added to form ZnS wraps at the outer surface of the cores of quantum dots. Thus, the surfaces of the quantum dots are inactivated. After the preparing steps have been done, the mixed solution is generally cooled and dried through centrifugation for forming powders of the quantum dots.

The present invention uses a semiconductor-dopant-core structure to enhance the dispersion of the dopants in the quantum dots. Furthermore, the semiconductor-dopant structure can prevent the dopants from separating out of the quantum dots. Therefore, the method of the present invention can be applied to implantation of various kinds of dopants owing to its structural dispersion and fixing techniques. Also, the addition of dopant precursor and formation of shell wrap can be carried out alternatively and repeatedly, and thereby the dopants can be wrapped and fixed between the shells.

DETAILED DESCRIPTION OF THE PREFERRED EMBODIMENTS

Figure 1:
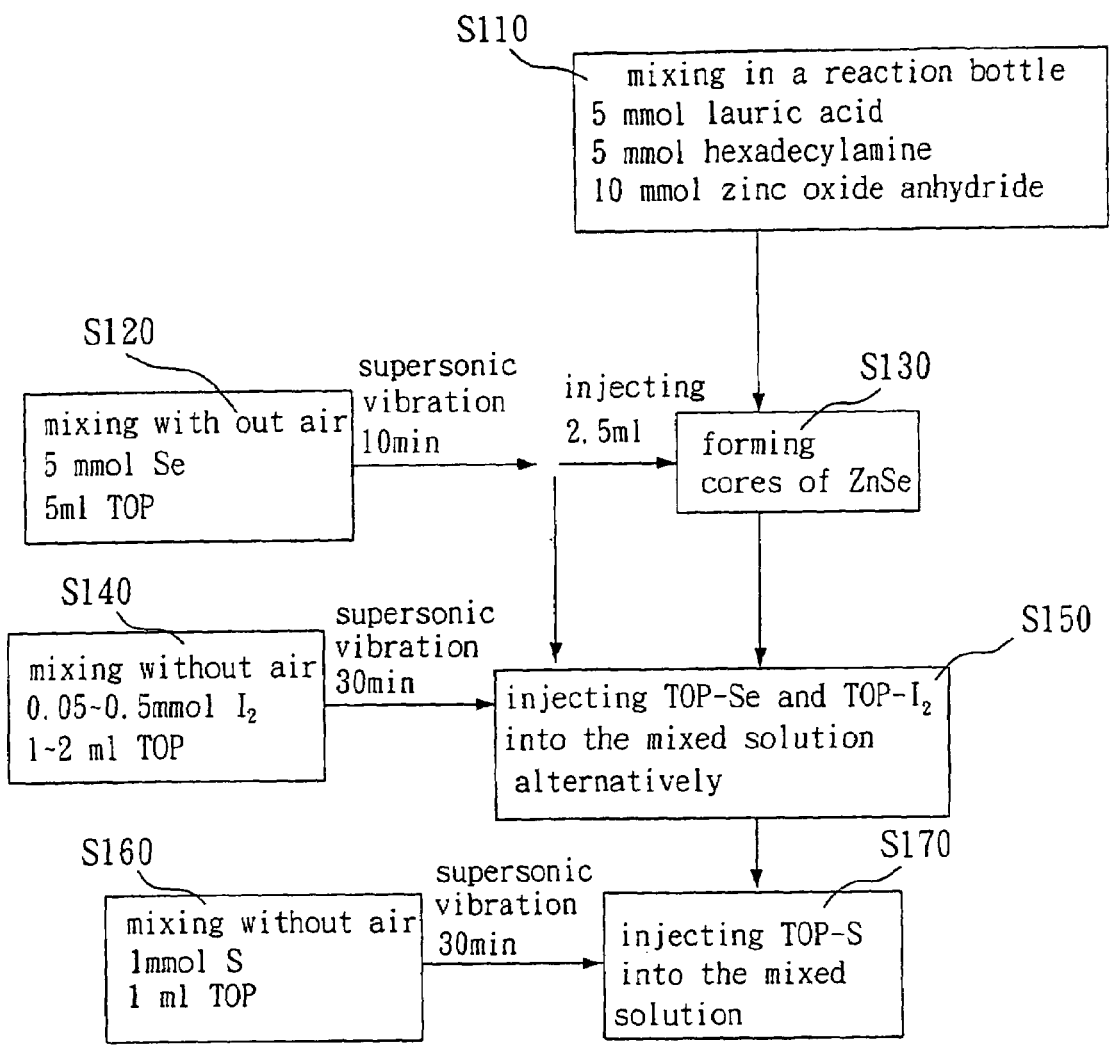
FIG. 1 shows the process flow of the preferred embodiment of the present invention.

Embodiment 1: Implantation of Iodine Element into ZnSe Quantum Dots by Multi-Layer Wrap Doping The wavelength of the radiation of CdSe quantum dots ranges from 500 to 800 nm, and is nearly proportional to the particle size. However, the wavelength of the radiation of ZnSe quantum dots ranges from 400 to 450 nm, and cannot be red shifted to other wave band by simply adjusting the particle size. Therefore, it is necessary to change the wave band of radiation by using the doping technique. The process for preparing ZnSe quantum dots with multi-layer wrapping shell is shown in FIG. 1.

Figure 2A:
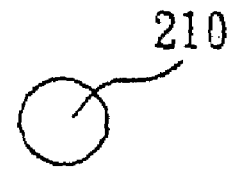
FIGS. 2a~2d show the cutaway views of the quantum dots.
Figure 2B:
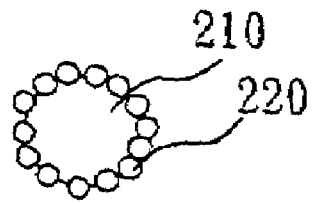
Figure 2C:
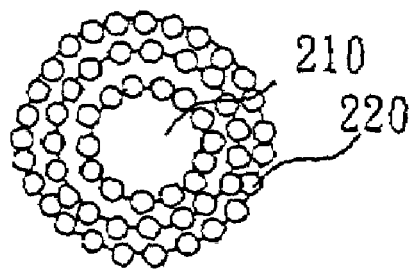
Figure 2D:
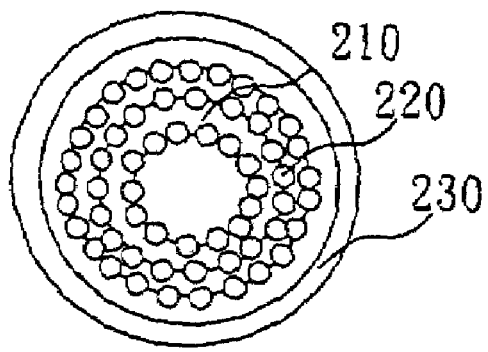

First, 5 mmol of lauric acid, 5 mmol of hexadecylamine (HDA), and 10 mmol of zinc oxide anhydride are mixed and heated to 280° C. under argon atmosphere in a reaction bottle in step S110. Simultaneously, 5 mmol of Se and 5 ml of tri-n-octylphosphine (TOP) are mixed and dispersed by supersonic vibration for 10 minutes in an environment without air in step S120. Afterwards, 2.5 ml of solution prepared in step S120 is injected into the solution prepared in step S110 to form a mixed solution of the cores of un-doped ZnSe quantum dots 210 in step S130 (as shown in FIG. 2a). Moreover, 0.05~0.5 mmol of $I_2$ and 1~2 ml of TOP are mixed with the assistance of supersonic vibration under an environment without air in step S140. Subsequently, in step S150, 0.5 ml of TOP-Se solution prepared in step S120 is injected into the mixed solution prepared in step S130. After one minute, 0.5 ml of TOP-$I_2$ solution prepared in step S140 is also injected into the mixed solution prepared in step S130. Consequently, ZnSe quantum dots 210 wrapped with $I_2$ dopants 220 (ZnSe/I) is formed in the mixed solution, as shown in FIG. 2b. If the TOP-Se solution and the TOP-$I_2$ solution are injected into the mixed solution alternatively at a time interval of one minute and repeatedly for three times, ZnSe/I/ZnSe quantum dots with multilayer dopant structure would be formed, as shown in FIG. 2c. Next, in step S160, 1 mmol of S and 1 ml of TOP are mixed with the assistance of supersonic vibration for 10 minutes in an environment without air. Thereafter, in step S170, 1 ml of the solution prepared in step S160 is added slowly into the solution prepared in step S150 to form the ZnSe/I/ZnSe quantum dots wrapped with ZnS shell 230, i.e. ZnSe/I/ZnSe/ZnS, as shown in FIG. 2d.

Figure 3:
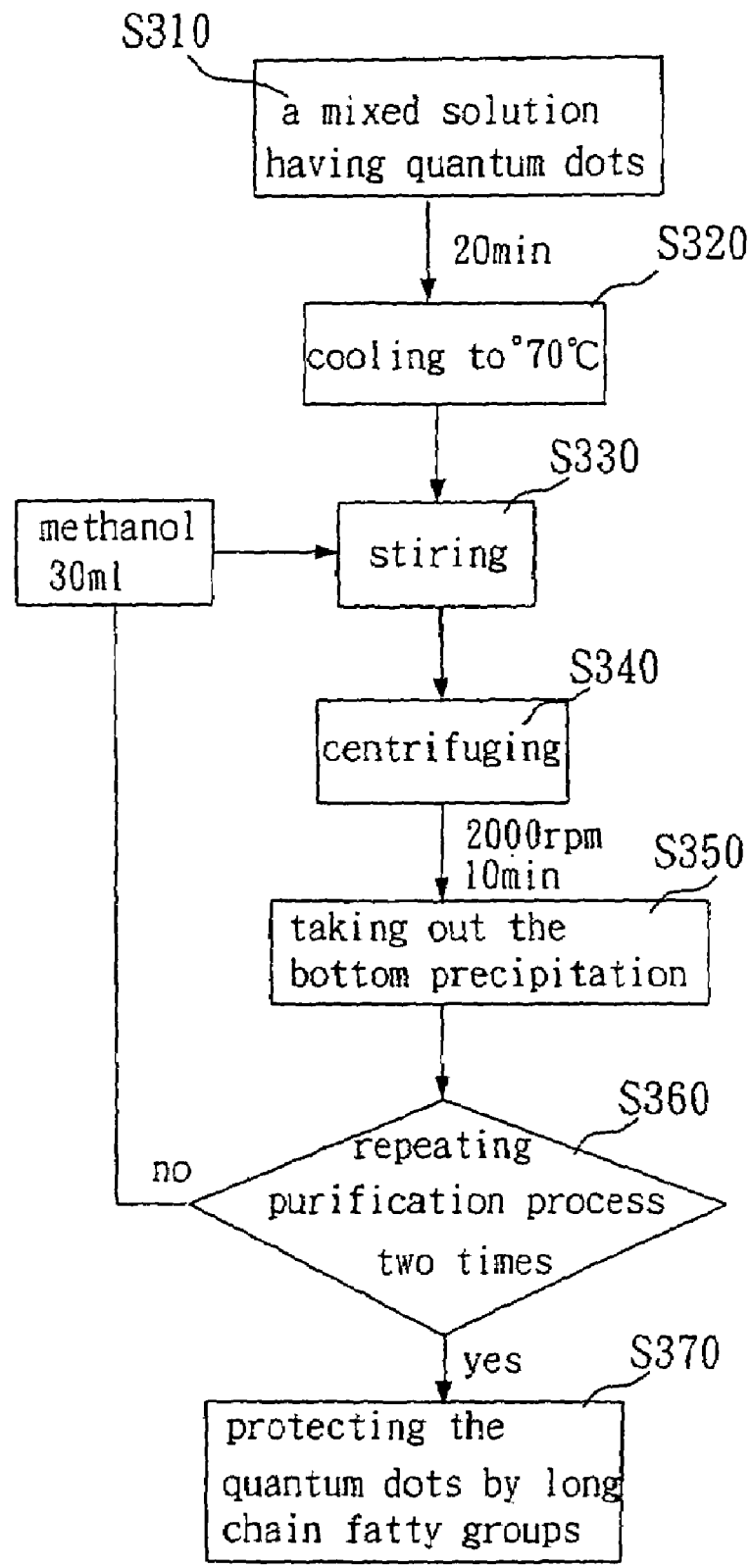
FIG. 3 shows the process flow for purifying the quantum dots of the present invention.
Figure 4:
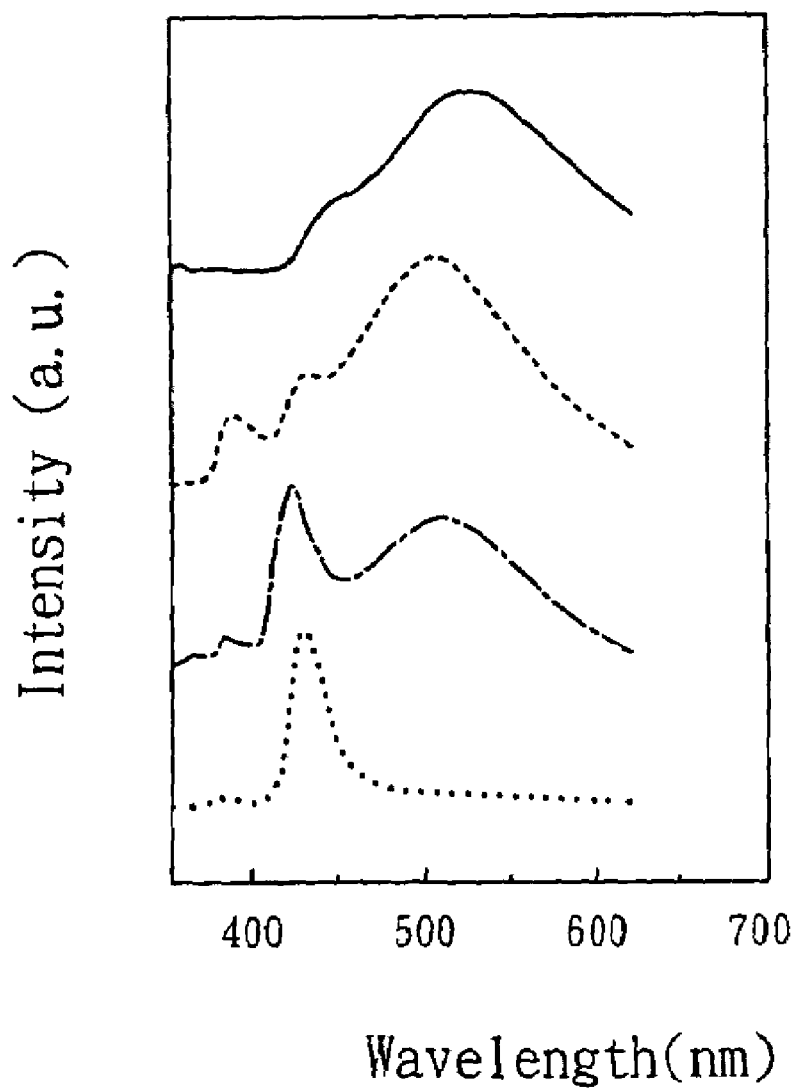
FIG. 4 shows the relationship between the wavelength of the quantum dots and the intensity of emission.
Figure 5:
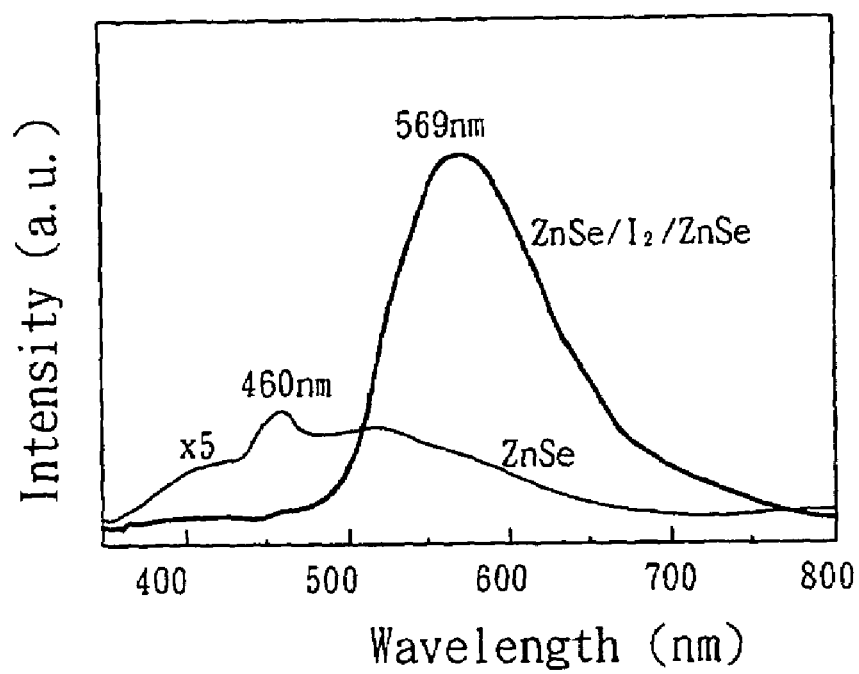
FIG. 5 shows the relationship between the wavelength of the quantum dots and the intensity of emission.
Figure 6:
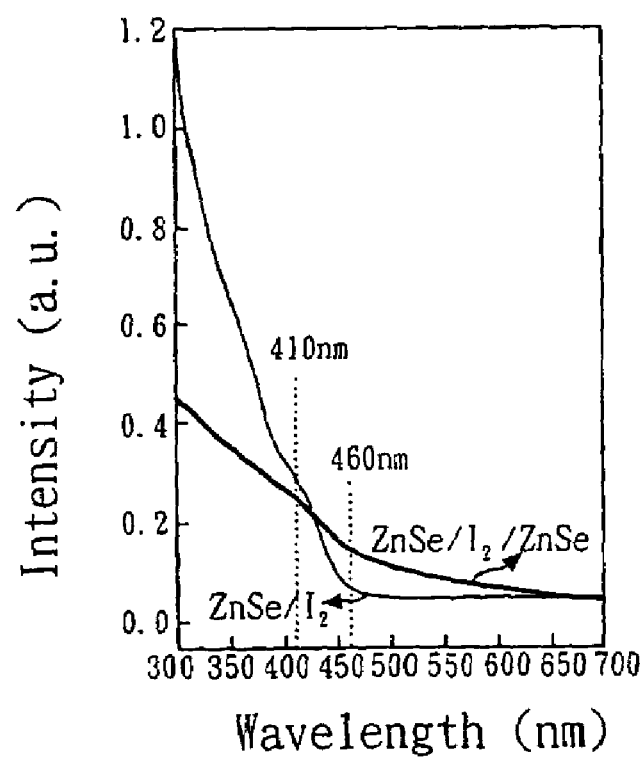
FIG. 6 shows the relationship between the wavelength of the quantum dots and the intensity of absorption lights.

Afterwards, the mixed solution is purified according to the purification process shown in FIG. 3, and the intensity of emission and particle size are analyzed. In step S310, the solutions prepared in step S130, S150, and S170 are taken out and continue to react for another 20 minutes. Thereafter, those solutions are cooled to 70° C. in step S320, and then fully mixed with methanol in step S330. Subsequently, the solutions are dried by a centrifuge, of which the centrifugal speed is 2000 rpm, for 10 minutes in step S340. Then, the bottom precipitation is taken out in step S350 and undergoes the purification process again in step S360. Finally, the quantum dots protected by long chain fatty groups are obtained in step S370. The diameters of the resulted quantum dots range approximately from 4 to 6 nm through the measurement. The spectroscopy of the emission is shown in FIG. 4. From the FIG. 4 we can see that the particle sizes of the ZnSe quantum dots are nearly the same. Using 325 nm as the excitation light source, it is mainly the purple emission and free of excitonic emission. As for the ZnSe quantum dots wrapped with one layer of dopants and prepared from step S150, only part of blue lights transfers into green lights (seen from the distribution of wavelength marked with ZnSe/I), and the radiation efficiency is slightly increased. With regard to the ZnSe:I quantum dots having multi-layer dopants and prepared from step S150, almost all the blue lights are transferred into green photoluminescence light, and the radiation efficiency is increased substantially (seen from the distribution of wavelength marked with ZnSe/I/ZnSe). If the ZnSe:I quantum dots are further wrapped with an outer shell ZnS, it is found that the radiation wave band will be further red shifted to the long wavelength. Furthermore, the intensity of radiation of ZnSe/I/ZnSe quantum dots is 11 times that of the un-doped quantum dots, i.e. the ZnSe quantum dots, as shown in FIG. 5. From FIG. 6 we can see that as the number of doping layer of the ZnSe quantum dots increases, the absorption spectroscopy tends to red shift and having a wider absorption range. Comparing with the photoluminescence spectroscopy of ZnSe:I quantum wells prepared by chemical vapor transport (CVT) method, they produce similar radiation bands, of which the peak are located at 590 nm and the full width at half maximum is 100 nm. If the thickness of wrap and condition of addition are well adjusted, it is possible to narrow the wave band of radiation and increase the radiation efficiency further owing to its better confinement effect. The method proposed by the present invention can prevent the dopants from precipitating by forming a suitable thickness of shell and adjust the particle size by controlling the temperature and time for growing the crystal.

In the present embodiment, the dopant can also be manganese (Mn), copper (Cu), or chlorine (Cl). Take Mn for example, the preparing process is the same as those mentioned above, except that in step S140, $Mn(CH_3)_2$ and TOP are mixed under no air circumstance with the aid of supersonic vibration. Besides, in addition to the solvent and high temperature process used in Embodiment 1, other solvents and reaction temperatures can also be used in the method of the present invention.

Doping is the basic technique in forming powders for electronic, magnetic and optical applications, and can be applied to the white light LED, the fluorescent powder, the sensing device of optical sensor or chemical sensor, or the display.

The present invention forms quantum dots with multi-layer wrap shell by the reaction mechanism of alternative and repeated injection and surface adsorption and, therefore, the precipitation of dopants is effectively avoided. Moreover, the dopants can be well fixed in the interior of the quantum dots and thereby the radiation properties of the quantum dots are improved.

The above detailed description are given by way of example and not intended to limit the invention solely to the embodiments described herein.

The invention claimed is:

1. A method for doping quantum dots, comprising the steps of:
    (a) providing a first precursor solution containing a group II element and a second precursor solution containing a group VI element;
    (b) heating and mixing the first precursor solution and the second precursor solution for forming a mixed solution having a plurality of cores of quantum dots dispersing therein; and
    (c) adding a third precursor solution containing a group VI element and a forth precursor solution having at least one dopant into the mixed solution alternatively at a fixed time interval for forming quantum dots wrapped with dopant; wherein the dopant is selected from a group consisting of transitional metals and halogen elements.

2. The method as claimed in claim 1, wherein the group II element is zinc (Zn), cadmium (Cd), or mercury (Hg).

3. The method as claimed in claim 1, wherein the group VI element is oxygen (O), sulfur (S), selenium (Se), or tellurium (Te).

4. The method as claimed in claim 1, wherein the core of the quantum dot is composed of ZnSe, CdSe, CdS, HgS, ZnO, ZnS, SnS, ZnTe, or CdTe.

5. The method as claimed in claim 1, wherein the transitional metal is Sc, Ti, V, Cr, Mn, Fe, Co, Ni, Cu, Zn, Y. Zr, Nb, Mo, Tc, Ru, Rh, Pd, Ag, Cd, La, Hf, Ta, W, Re, Os, Ir, Pt, or Au.

6. The method as claimed in claim 1, wherein the halogen element is chlorine (Cl) or iodine (I).

7. The method as claimed in claim 1, wherein the second precursor solution contains a tri-n-octylphosphine (TOP) solvent.

8. The method as claimed in claim 1, wherein the third precursor solution contains a tri-n-octylphosphine (TOP) solvent.

9. The method as claimed in claim 1, wherein the first precursor solution contains a hexadecylamine (HDA) solvent.

10. The method as claimed in claim 9, wherein the first precursor solution further has a lauric acid solvent or a stearic acid solvent.

11. The method as claimed in claim 1, wherein the fourth precursor solution is formed by mixing an organic metal, a metal salt, a metal compound, or a metal element with the TOP.

12. The method as claimed in claim 11, wherein the mixing method in step (b) is supersonic vibration.

13. The method as claimed in claim 1, wherein the fourth precursor solution is composed of a halogen element and TOP.

14. The method as claimed in claim 1 further comprising a step (c') adding a ZnS precursor solution for forming quantum dots wrapped with ZnS after step (c).

15. The method as claimed in claim 1 further comprising a step (d) cooling and drying the mixed solution by centrifugation method for forming powders of the quantum dots after step (c).

16. The method as claimed in claim 1, wherein the heating temperature in step (b) ranges from 200 to 400° C.

17. The method as claimed in claim 1, wherein the number of times that the third and fourth precursor solutions are added into the mixed solution range from 2 to 8 in step (c).

18. The method as claimed in claim 1, wherein the time interval between the addition of the third and fourth precursor solutions in step (c) ranges from 30 seconds to 3 minutes.

* * * * *